United States Patent
Fujimaki

(10) Patent No.: US 12,105,426 B2
(45) Date of Patent: Oct. 1, 2024

(54) LINE NARROWED GAS LASER APPARATUS, CONTROL METHOD THEREFOR, ELECTRONIC DEVICE MANUFACTURING METHOD

(71) Applicant: Gigaphoton Inc., Tochigi (JP)

(72) Inventor: Yousuke Fujimaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 259 days.

(21) Appl. No.: 17/819,060

(22) Filed: Aug. 11, 2022

(65) Prior Publication Data

US 2022/0385029 A1 Dec. 1, 2022

Related U.S. Application Data

(63) Continuation of application No. PCT/JP2020/012543, filed on Mar. 19, 2020.

(51) Int. Cl.
G03F 7/00 (2006.01)
G03F 7/20 (2006.01)
(Continued)

(52) U.S. Cl.
CPC ........ G03F 7/70041 (2013.01); G03F 7/2006 (2013.01); H01S 3/08009 (2013.01); H01S 3/1305 (2013.01); H01S 3/134 (2013.01)

(58) Field of Classification Search
CPC .... H01S 3/08009; H01S 3/1305; H01S 3/134; H01S 3/0809; H01S 3/10069; H01S 3/11;
(Continued)

(56) References Cited

U.S. PATENT DOCUMENTS

| 4,745,618 A * | 5/1988 | Burger ............... H01S 3/0401 372/101 |
| 7,088,758 B2 | 8/2006 | Sandstrom et al. |

(Continued)

FOREIGN PATENT DOCUMENTS

| JP | H11-204894 A | 7/1999 |
| JP | 2006269628 A | 10/2006 |

(Continued)

OTHER PUBLICATIONS

International Search Report issued in PCT/JP2020/012543; mailed Jun. 9, 2020.
(Continued)

Primary Examiner — Deoram Persaud
(74) Attorney, Agent, or Firm — Studebaker & Brackett PC

(57) ABSTRACT

A control method for a line narrowed gas laser apparatus is a control method for a line narrowed gas laser apparatus configured to emit a pulse laser beam including a first wavelength component and a second wavelength component. The apparatus includes a laser chamber including a pair of electrodes, an optical resonator including an adjustment mechanism configured to adjust a parameter of an energy ratio of the first and second wavelength components, and a processor in which relation data indicating a relation of the parameter of the energy ratio with a control parameter of the adjustment mechanism is stored. The control method includes receiving a command value of the parameter of the energy ratio from an external device, and acquiring, based on the relation data, a value of the control parameter corresponding to the command value and controlling the adjustment mechanism based on the value of the control parameter.

20 Claims, 11 Drawing Sheets

(51) Int. Cl.
*H01S 3/08* (2023.01)
*H01S 3/13* (2006.01)
*H01S 3/134* (2006.01)

(58) Field of Classification Search
CPC .......... H01S 3/136; H01S 3/137; H01S 3/139; H01S 3/2251; G03F 7/2006; G03F 7/70041; G03F 7/70558
See application file for complete search history.

(56) References Cited

U.S. PATENT DOCUMENTS

| | | | |
|---|---|---|---|
| 7,154,928 B2 | 12/2006 | Sandstrom et al. | |
| 2008/0267242 A1* | 10/2008 | Ershov | G03F 7/70583 372/57 |
| 2013/0215916 A1 | 8/2013 | Kakizaki et al. | |
| 2018/0261973 A1* | 9/2018 | Fujimaki | H01S 3/038 |
| 2019/0107438 A1* | 4/2019 | Moriya | H01J 61/20 |
| 2022/0385022 A1* | 12/2022 | Kumazaki | H01S 3/137 |
| 2022/0385027 A1* | 12/2022 | Kumazaki | H01S 3/08009 |
| 2022/0390851 A1* | 12/2022 | Fujii | G03F 7/70025 |
| 2022/0393425 A1* | 12/2022 | Tamaru | H01S 3/0064 |
| 2024/0128706 A1* | 4/2024 | Ishida | G03F 7/20 |
| 2024/0186760 A1* | 6/2024 | Yabu | G03F 7/70025 |

FOREIGN PATENT DOCUMENTS

| | | |
|---|---|---|
| JP | 2013-062484 A | 4/2013 |
| WO | 2019079010 A1 | 4/2019 |

OTHER PUBLICATIONS

International Preliminary Report on Patentability and Written Opinion issued in PCT/JP2020/012543; issued Sep. 20, 2022.

* cited by examiner

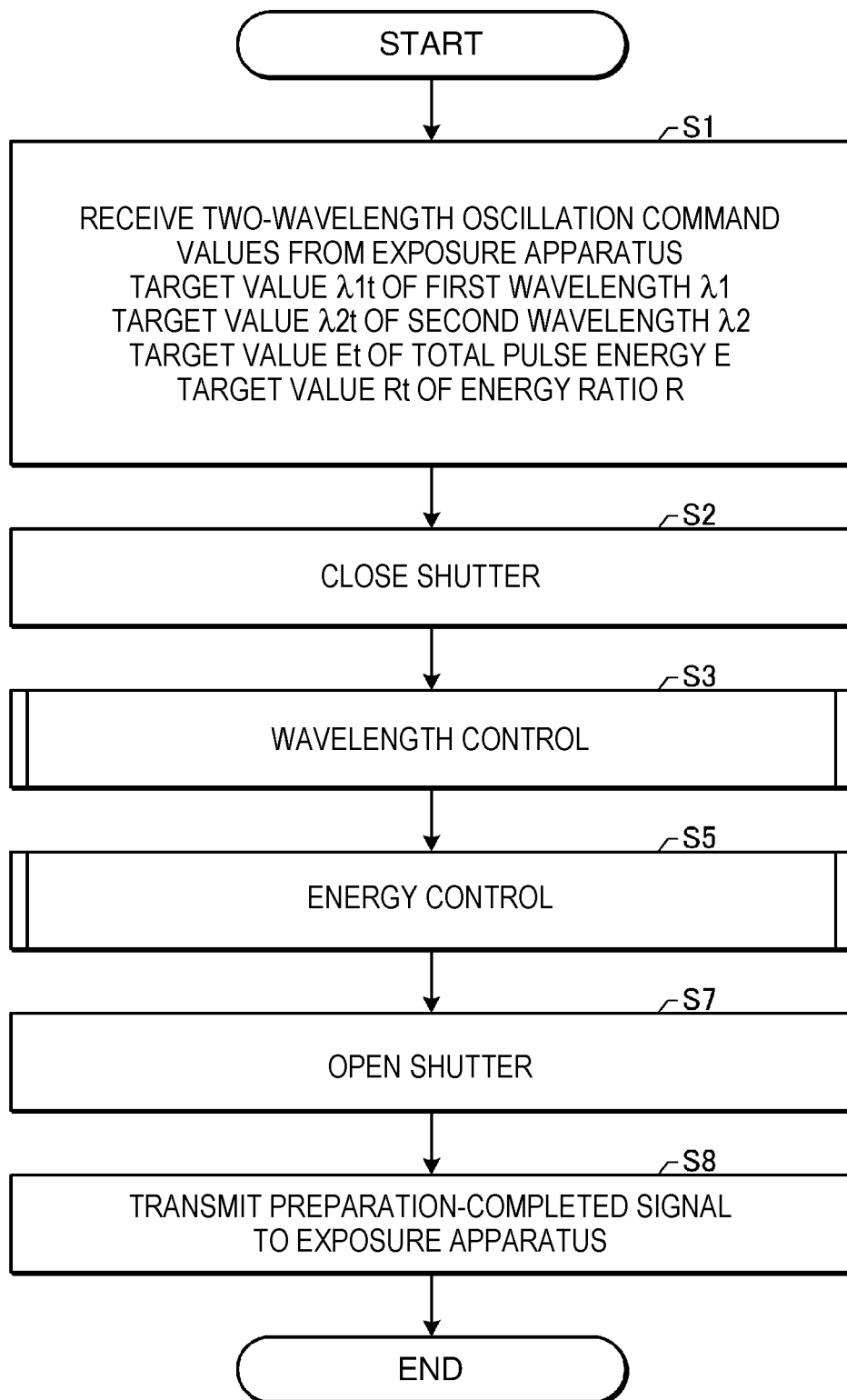

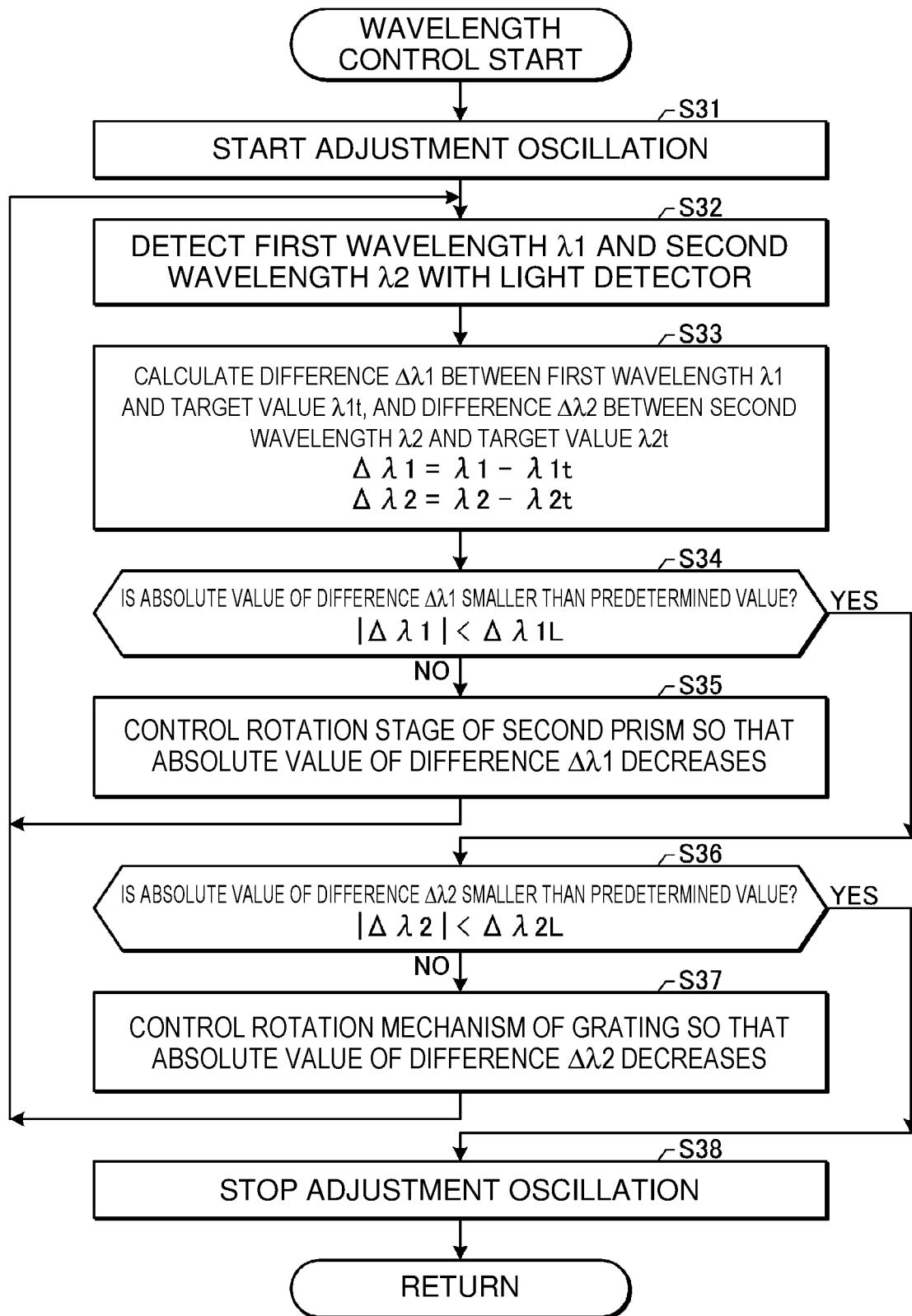

ENERGY RATIO R(i) RELATIVE TO CONTROL
PARAMETER Y(i) OF LINEAR STAGE

| CONTROL PARAMETER Y(i) OF LINEAR STAGE | ENERGY RATIO R(i) |
|---|---|
| Y(0) | R(0) |
| Y(1) | R(1) |
| Y(2) | R(2) |
| ... | ... |
| Y(I) | R(I) |

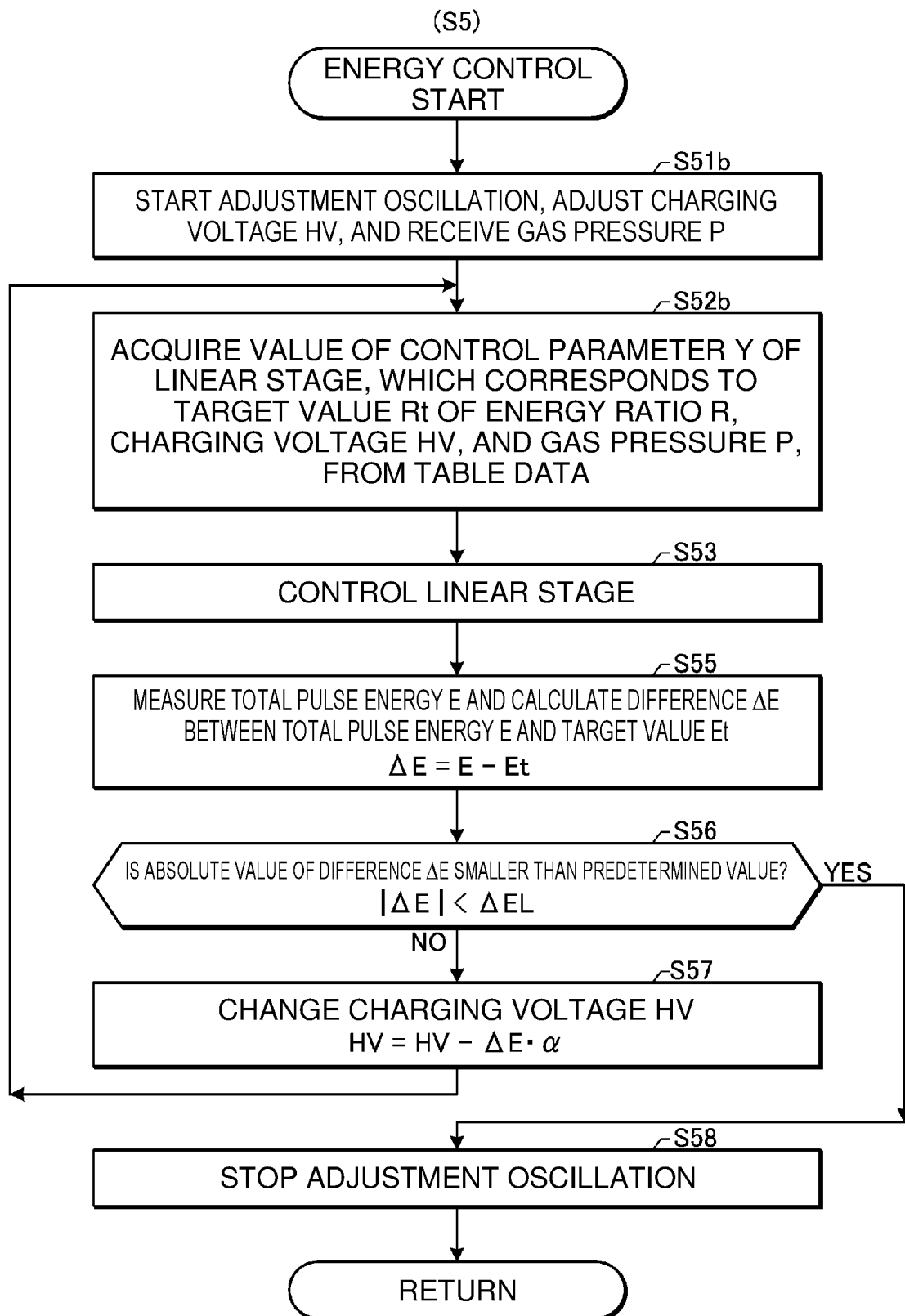

Fig. 11A

ENERGY RATIO R(1jk) RELATIVE TO CONTROL
PARAMETER Y(1) OF LINEAR STAGE

| | | CHARGING VOLTAGE HV(k) | | | | |
|---|---|---|---|---|---|---|
| | | HV(0) | HV(1) | HV(2) | ... | HV(K) |
| GAS PRESSURE P(j) | P(0) | R(100) | R(101) | R(102) | ... | R(10K) |
| | P(1) | R(110) | R(111) | R(112) | ... | R(11K) |
| | P(2) | R(120) | R(121) | R(122) | ... | R(12K) |
| | ... | ... | ... | ... | ... | ... |
| | P(J) | R(1J0) | R(1J1) | R(1J2) | ... | R(1JK) |

Fig. 11B

ENERGY RATIO R(2jk) RELATIVE TO CONTROL
PARAMETER Y(2) OF LINEAR STAGE

| | | CHARGING VOLTAGE HV(k) | | | | |
|---|---|---|---|---|---|---|
| | | HV(0) | HV(1) | HV(2) | ... | HV(K) |
| GAS PRESSURE P(j) | P(0) | R(200) | R(201) | R(202) | ... | R(20K) |
| | P(1) | R(210) | R(211) | R(212) | ... | R(21K) |
| | P(2) | R(220) | R(221) | R(222) | ... | R(22K) |
| | ... | ... | ... | ... | ... | ... |
| | P(J) | R(2J0) | R(2J1) | R(2J2) | ... | R(2JK) |

LINE NARROWED GAS LASER APPARATUS, CONTROL METHOD THEREFOR, ELECTRONIC DEVICE MANUFACTURING METHOD

CROSS-REFERENCE TO RELATED APPLICATIONS

The present application is a continuation application of International Application No. PCT/JP2020/012543, filed on Mar. 19, 2020, the entire contents of which are hereby incorporated by reference.

BACKGROUND

Technical Field

The present disclosure relates to a line narrowed gas laser apparatus, a control method therefor, and an electronic device manufacturing method.

Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to emit a laser beam having a wavelength of 248 nm approximately and an ArF excimer laser apparatus configured to emit a laser beam having a wavelength of 193 nm approximately.

The KrF excimer laser apparatus and the ArF excimer laser apparatus have a wide spectrum line width of 350 to 400 pm for spontaneous oscillation light. Thus, chromatic aberration occurs in some cases when a projection lens is made of a material that transmits ultraviolet light such as a KrF or ArF laser beam. As a result, resolving power potentially decreases. Thus, the spectrum line width of a laser beam emitted from such a gas laser apparatus needs to be narrowed until chromatic aberration becomes negligible. To narrow the spectrum line width, a line narrowing module (LNM) including a line narrowing element (for example, etalon or grating) is provided in a laser resonator of the gas laser apparatus in some cases. In the following description, a gas laser apparatus that achieves narrowing of the spectrum line width is referred to as a line narrowed gas laser apparatus.

LIST OF DOCUMENTS

Patent Documents

Patent Document 1: U.S. Pat. No. 7,088,758
Patent Document 2: U.S. Pat. No. 7,154,928
Patent Document 3: International Patent Publication No. 2019/079010
Patent Document 4: Japanese Unexamined Patent Application Publication No. 2006-269628

SUMMARY

A control method for a line narrowed gas laser apparatus according to an aspect of the present disclosure is a control method for a line narrowed gas laser apparatus configured to emit a pulse laser beam including a first wavelength component and a second wavelength component. The line narrowed gas laser apparatus includes a laser chamber including a pair of electrodes, an optical resonator including an adjustment mechanism configured to adjust a parameter of an energy ratio of the first wavelength component and the second wavelength component, and a processor in which relation data indicating a relation of the parameter of the energy ratio with a control parameter of the adjustment mechanism is stored. The control method includes receiving a command value of the parameter of the energy ratio from an external device, and acquiring, based on the relation data, a value of the control parameter corresponding to the command value and controlling the adjustment mechanism based on the value of the control parameter.

A line narrowed gas laser apparatus according to another aspect of the present disclosure is a line narrowed gas laser apparatus configured to emit a pulse laser beam including a first wavelength component and a second wavelength component and includes a laser chamber including a pair of electrodes, an optical resonator including an adjustment mechanism configured to adjust a parameter of an energy ratio of the first wavelength component and the second wavelength component, and a processor configured to store relation data indicating a relation of the parameter of the energy ratio with a control parameter of the adjustment mechanism, receive a command value of the parameter of the energy ratio from an external device, acquire, based on the relation data, a value of the control parameter corresponding to the command value, and control the adjustment mechanism based on the value of the control parameter.

An electronic device manufacturing method according to another aspect of the present disclosure includes generating a pulse laser beam with a line narrowed gas laser apparatus, emitting the pulse laser beam to an exposure apparatus, and exposing a photosensitive substrate with the pulse laser beam in the exposure apparatus to manufacture an electronic device. The line narrowed gas laser apparatus is a line narrowed gas laser apparatus configured to emit a pulse laser beam including a first wavelength component and a second wavelength component and includes a laser chamber including a pair of electrodes, an optical resonator including an adjustment mechanism configured to adjust a parameter of an energy ratio of the first wavelength component and the second wavelength component, and a processor configured to store relation data indicating a relation of the parameter of the energy ratio with a control parameter of the adjustment mechanism, receive a command value of the parameter of the energy ratio from an external device, acquire, based on the relation data, a value of the control parameter corresponding to the command value, and control the adjustment mechanism based on the value of the control parameter.

BRIEF DESCRIPTION OF THE DRAWINGS

Embodiments of the present disclosure will be described below as examples with reference to the accompanying drawings.

FIG. 5 is a flowchart illustrating the processing procedure of two-wavelength oscillation in the first embodiment.

FIG. 6 is a flowchart illustrating the processing procedure of wavelength control of two-wavelength oscillation.

FIG. 10 is a flowchart illustrating the processing procedure of energy control of two-wavelength oscillation in a second embodiment.

FIG. 11A conceptually illustrates table data stored in a memory.

FIG. 11B conceptually illustrates table data stored in the memory.

DESCRIPTION OF EMBODIMENTS

Contents

1. Comparative example
   1.1 Exposure system
   1.1.1 Configuration of exposure apparatus 100
   1.1.2 Operation
   1.2 Line narrowed gas laser apparatus
   1.2.1 Configuration
   1.2.1.1 Master oscillator MO
   1.2.1.2 Laser control processor 30
   1.2.1.3 Gas adjustment device GA
   1.2.2 Operation
   1.2.2.1 Laser control processor 30
   1.2.2.2 Master oscillator MO
   1.2.2.3 Gas adjustment device GA
   1.3 Line narrowing device
   1.3.1 Configuration
   1.3.1.1 First and second prisms 41 and 42
   1.3.1.2 Grating system 50
   1.3.2 Operation
   1.3.3 Problem with comparative example
2. Line narrowed gas laser apparatus configured to adjust energy ratio R by referring to table data
   2.1 Configuration
   2.2 Operation of line narrowed gas laser apparatus
   2.3 Control of two-wavelength oscillation by laser control processor 30
   2.3.1 Wavelength control of two-wavelength oscillation
   2.3.2 Energy control of two-wavelength oscillation
   2.4 Effect
3. Line narrowed gas laser apparatus configured to adjust energy ratio R with taken into account charging voltage HV and gas pressure P
   3.1 Configuration and operation
   3.2 Effect
4. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example

1.1 Exposure System

Figure 1:
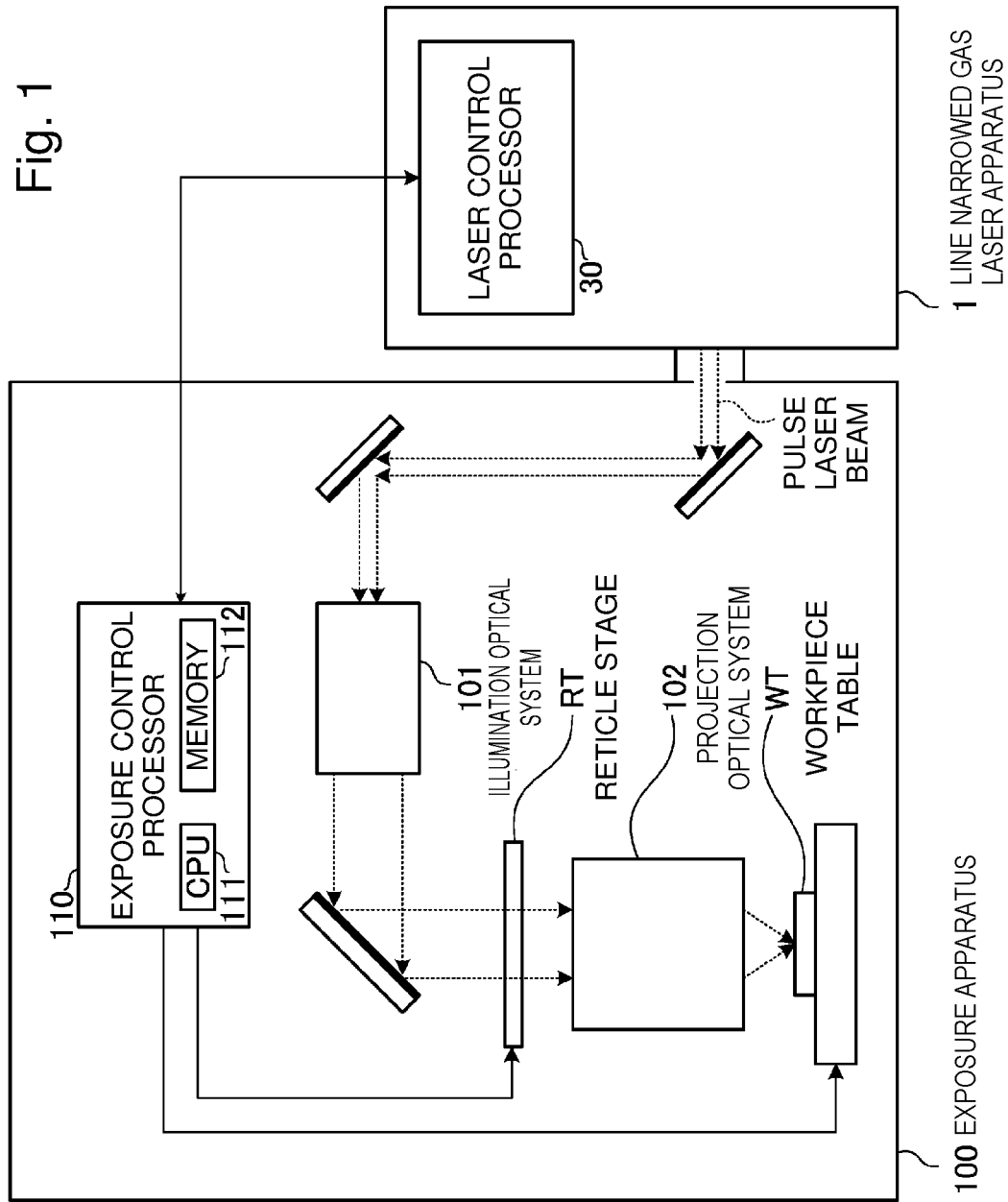
FIG. 1 schematically illustrates the configuration of an exposure system in a comparative example.
Figure 2:
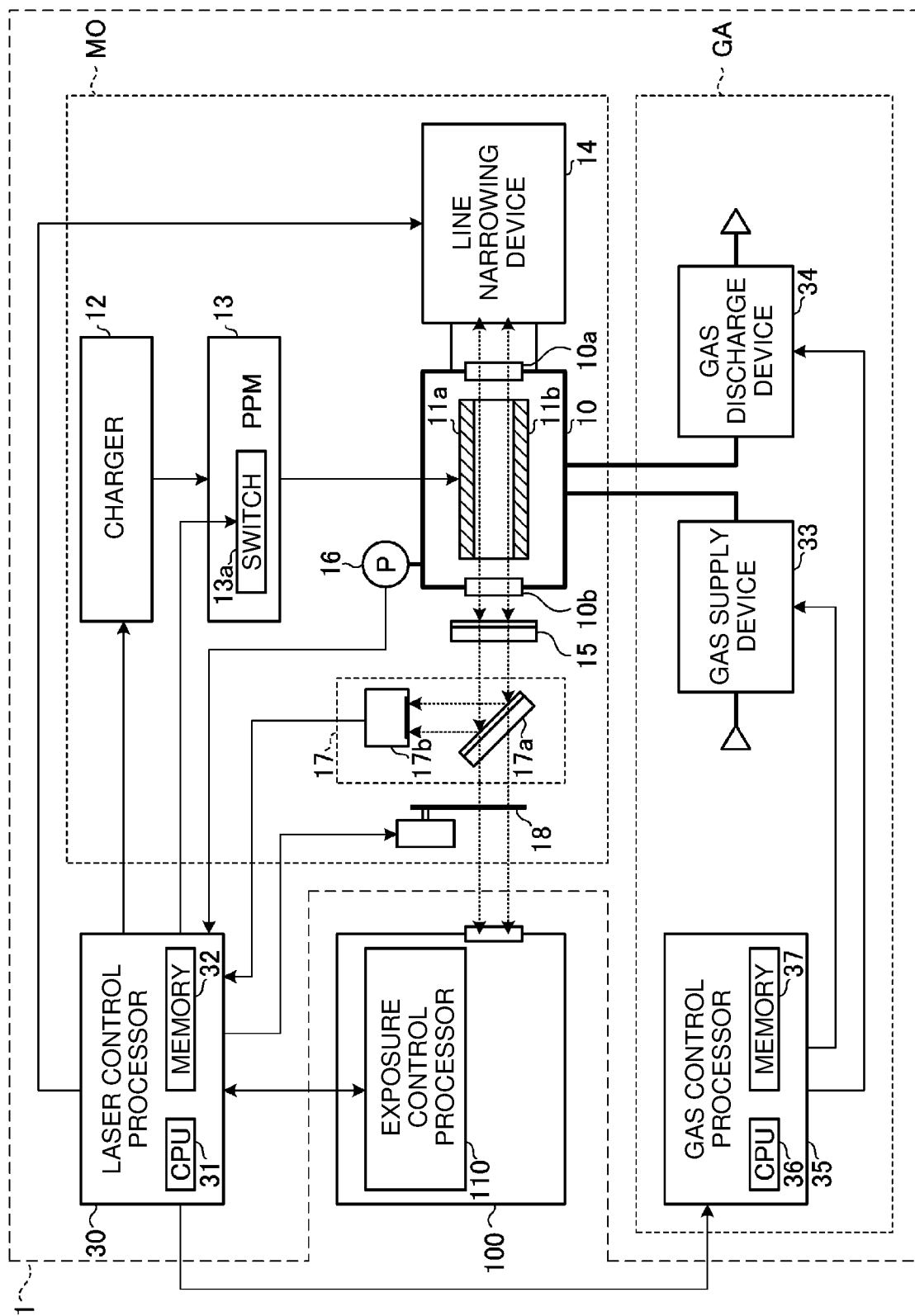
FIG. 2 schematically illustrates the configuration of the exposure system in the comparative example.

FIGS. 1 and 2 schematically illustrate the configuration of an exposure system in a comparative example. The comparative example of the present disclosure is an example that the applicant recognizes as known only by the applicant, but is not a publicly known example that is recognized by the applicant.

The exposure system includes a line narrowed gas laser apparatus 1 and an exposure apparatus 100. In FIG. 1, the line narrowed gas laser apparatus 1 is simplified. In FIG. 2, the exposure apparatus 100 is simplified.

The line narrowed gas laser apparatus 1 includes a laser control processor 30. The line narrowed gas laser apparatus 1 emits a pulse laser beam toward the exposure apparatus 100.

1.1.1 Configuration of Exposure Apparatus 100

As illustrated in FIG. 1, the exposure apparatus 100 includes an illumination optical system 101, a projection optical system 102, and an exposure control processor 110. The exposure apparatus 100 corresponds to an external device in the present disclosure.

The illumination optical system 101 illuminates a reticle pattern of a non-illustrated reticle disposed on a reticle stage RT with the pulse laser beam incident from the line narrowed gas laser apparatus 1.

The pulse laser beam having transmitted through the reticle is imaged on a non-illustrated workpiece disposed on a workpiece table WT by reduced projection through the projection optical system 102. The workpiece is a photosensitive substrate such as a semiconductor wafer on which a resist film is applied.

The exposure control processor 110 is a processing device including a memory 112 in which a control program is stored and a central processing unit (CPU) 111 configured to execute the control program. The exposure control processor 110 is specially configured or programmed to execute various kinds of processing included in the present disclosure. The exposure control processor 110 collectively controls the exposure apparatus 100 and transmits and receives various kinds of data and various signals to and from the laser control processor 30.

1.1.2 Operation

The exposure control processor 110 transmits data of a wavelength target value, data of a pulse energy target value, and a trigger signal to the laser control processor 30. The laser control processor 30 controls the line narrowed gas laser apparatus 1 in accordance with the data and signals.

The exposure control processor 110 translates the reticle stage RT and the workpiece table WT in directions opposite to each other in synchronization. Accordingly, the workpiece is exposed to the pulse laser beam reflected by the reticle pattern.

Through such an exposure process, the reticle pattern is transferred to the semiconductor wafer. Thereafter, an electronic device can be manufactured through a plurality of processes.

1.2 Line Narrowed Gas Laser Apparatus

1.2.1 Configuration

As illustrated in FIG. 2, the line narrowed gas laser apparatus 1 includes a master oscillator MO and a gas adjustment device GA in addition to the laser control processor 30.

1.2.1.1 Master Oscillator MO

The master oscillator MO includes a laser chamber 10, a charger 12, a pulse power module (PPM) 13, a line narrowing device 14, an output coupling mirror 15, a light detector 17, and a shutter 18. The line narrowing device 14 and the output coupling mirror 15 constitute an optical resonator.

The laser chamber 10 is disposed on the optical path of the optical resonator. The laser chamber 10 is provided with windows 10a and 10b.

The laser chamber 10 includes a pair of electrodes 11a and 11b inside and houses laser gas as a laser medium. The laser medium is, for example, $F_2$, ArF, KrF, XeCl or XeF.

A pressure sensor 16 is attached to the laser chamber 10.

The charger 12 stores electric energy to be supplied to the pulse power module 13. The pulse power module 13 includes a switch 13a.

The line narrowing device 14 includes wavelength selection elements such as first and second prisms 41 and 42 and gratings 51 and 52 to be described later.

The output coupling mirror 15 is a partially reflective mirror.

The light detector 17 includes a beam splitter 17a and a sensor unit 17b. The beam splitter 17a is disposed on the optical path of a pulse laser beam output from the output coupling mirror 15. The beam splitter 17a transmits part of the pulse laser beam at high transmittance and reflects another part of the pulse laser beam into the sensor unit 17b. The sensor unit 17b includes a spectroscopic sensor and can output wavelength measured data. The sensor unit 17b also includes an energy sensor and can output pulse energy measured data.

The shutter 18 is disposed on the optical path of the pulse laser beam having transmitted through the beam splitter 17a. When the shutter 18 is closed, the pulse laser beam having transmitted through the beam splitter 17a is cut off not to enter the exposure apparatus 100. When the shutter 18 is opened, the pulse laser beam having transmitted through the beam splitter 17a is not cut off but enters the exposure apparatus 100.

1.2.1.2 Laser Control Processor 30

The laser control processor 30 is a processing device including a memory 32 in which a control program is stored and a CPU 31 configured to execute the control program. The laser control processor 30 is specially configured or programmed to execute various kinds of processing included in the present disclosure.

1.2.1.3 Gas Adjustment Device GA

The gas adjustment device GA includes a gas supply device 33, a gas discharge device 34, and a gas control processor 35.

The gas supply device 33 includes a non-illustrated valve provided to a first pipe between the laser chamber 10 and a non-illustrated gas tank.

The gas discharge device 34 includes a non-illustrated valve, pump, and detoxification device provided to a second pipe connected to the laser chamber 10.

The gas control processor 35 is a processing device including a memory 37 in which a control program is stored and a CPU 36 configured to execute the control program. The gas control processor 35 is specially configured or programmed to execute various kinds of processing included in the present disclosure.

1.2.2 Operation

1.2.2.1 Laser Control Processor 30

The laser control processor 30 acquires data of a wavelength target value from the exposure control processor 110. The laser control processor 30 transmits an initial setting signal to the line narrowing device 14 based on the wavelength target value. After pulse laser beam emission is started, the laser control processor 30 receives wavelength measured data from the light detector 17 and transmits a feedback control signal to the line narrowing device 14 based on the wavelength target value and the wavelength measured data.

The laser control processor 30 acquires data of a pulse energy target value from the exposure control processor 110. The laser control processor 30 transmits an initial setting signal of charging voltage HV to the charger 12 based on the pulse energy target value. After pulse laser beam emission is started, the laser control processor 30 receives pulse energy measured data from the light detector 17 and transmits a feedback control signal of the charging voltage HV to the charger 12 based on the pulse energy target value and the pulse energy measured data.

The laser control processor 30 receives a trigger signal from the exposure control processor 110. The laser control processor 30 transmits an oscillation trigger signal based on the trigger signal to the switch 13a of the pulse power module 13.

The laser control processor 30 transmits a gas control signal to the gas control processor 35. The laser control processor 30 receives measured data of gas pressure P from the pressure sensor 16 and transmits the measured data of the gas pressure P to the gas control processor 35.

1.2.2.2 Master Oscillator MO

When having received the oscillation trigger signal from the laser control processor 30, the switch 13a is turned on. When the switch 13a is turned on, the pulse power module 13 generates high voltage in pulses from the electric energy stored in the charger 12. The pulse power module 13 applies the high voltage to the electrodes 11a and 11b.

When the high voltage is applied to the electrodes 11a and 11b, discharging occurs between the electrodes 11a and 11b. Laser gas in the laser chamber 10 is excited by energy of the discharging and transitions to a higher energy level. Thereafter, when transitioning to a lower energy level, the excited laser gas discharges light of a wavelength in accordance with the difference between the energy levels.

The light generated in the laser chamber 10 is output out of the laser chamber 10 through the windows 10a and 10b. The light output through the window 10a is incident as an optical beam on the line narrowing device 14. Light near a desired wavelength in the light incident on the line narrowing device 14 is reflected by the line narrowing device 14 and returned to the laser chamber 10.

The output coupling mirror 15 transmits and outputs part of the light output through the window 10b and reflects and returns another part thereof to the laser chamber 10.

As described above, light output from the laser chamber 10 reciprocates between the line narrowing device 14 and the output coupling mirror 15. The light is amplified each time the light passes through a discharge space between the pair of electrodes 11a and 11b. In this manner, light provided with laser oscillation and line narrowing is output as a pulse laser beam from the output coupling mirror 15.

The pulse laser beam emitted from the line narrowed gas laser apparatus 1 enters the exposure apparatus 100.

1.2.2.3 Gas Adjustment Device GA

The gas control processor 35 controls the gas supply device 33 and the gas discharge device 34 based on the gas control signal received from the laser control processor 30 and the measured data of the gas pressure P such that the gas pressure P inside the laser chamber 10 becomes a desired value.

For example, to increase the gas pressure P inside the laser chamber 10, the gas control processor 35 performs control to open the valve included in the gas supply device 33 so that laser gas is supplied into the laser chamber 10. For example, to decrease the gas pressure P inside the laser chamber 10, the gas control processor 35 performs control to open the valve included in the gas discharge device 34 so that part of laser gas inside the laser chamber 10 is discharged.

1.3 Line Narrowing Device

1.3.1 Configuration

Figure 3A:
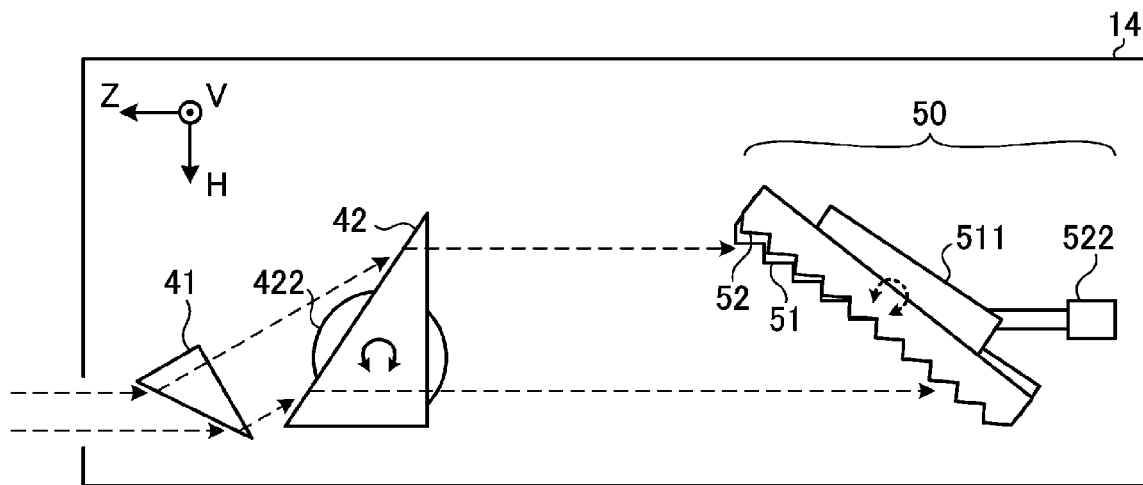
FIG. 3A schematically illustrates the configuration of a line narrowing device in the comparative example.
Figure 3B:
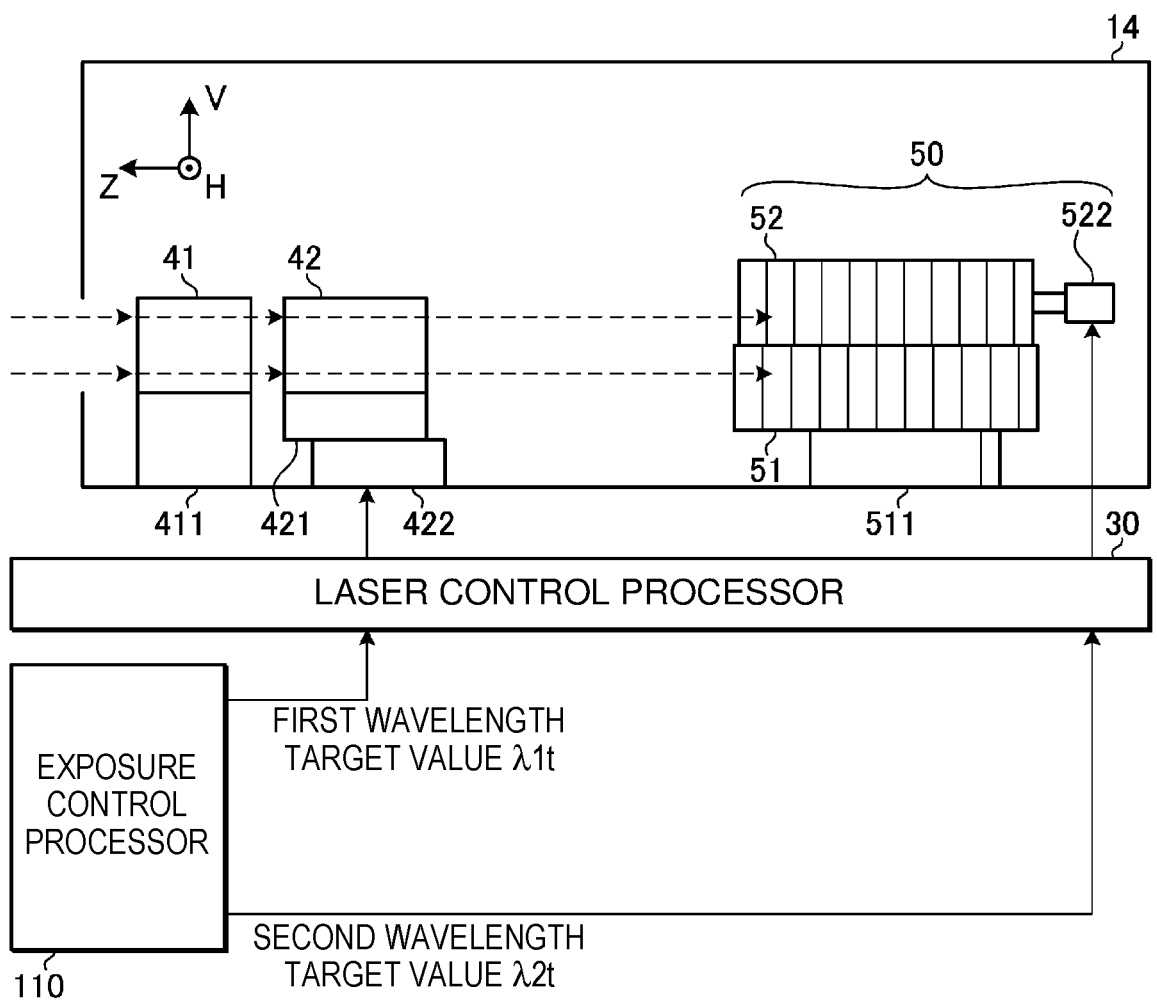
FIG. 3B schematically illustrates the configuration of the line narrowing device in the comparative example.

FIGS. 3A and 3B schematically illustrate the configuration of the line narrowing device 14 in the comparative example. A V axis, an H axis, and a Z axis that are orthogonal to one another are illustrated in each drawing. FIG. 3A illustrates the line narrowing device 14 viewed in the −V direction, and FIG. 3B illustrates the line narrowing device 14 viewed in the −H direction. The −V direction and the +V direction match directions in which the electrodes 11a and 11b (refer to FIG. 2) face each other. The −Z direction matches the traveling direction of an optical beam output from the window 10a. The +Z direction matches the traveling direction of a pulse laser beam output from the window 10b and then output through the output coupling mirror 15.

The line narrowing device 14 includes first and second prisms 41 and 42 and a grating system 50.

1.3.1.1 First and Second Prisms 41 and 42

The first prism 41 is disposed on the optical path of an optical beam output from the window 10a. The first prism 41 is supported by a holder 411.

The second prism 42 is disposed on the optical path of the optical beam having passed through the first prism 41. The second prism 42 is supported by a holder 421.

The first and second prisms 41 and 42 are made of a material such as calcium fluoride or synthetic quartz, which has a high transmittance for a wavelength selected by the line narrowing device 14.

The first and second prisms 41 and 42 are disposed such that surfaces of the first and second prisms 41 and 42 that the optical beam is incident on and output from are all parallel to the V axis. The second prism 42 is rotatable about an axis parallel to the V axis by a rotation stage 422.

1.3.1.2 Grating System 50

The grating system 50 includes the gratings 51 and 52. The gratings 51 and 52 are disposed at positions different from each other in the direction of the V axis on the optical path of the optical beam having passed through the second prism 42. The direction of grooves of the gratings 51 and 52 matches the direction of the V axis. The positions of the gratings 51 and 52 are set such that the optical beam having passed through the second prism 42 is incident over the gratings 51 and 52.

The gratings 51 and 52 are supported by a holder 511. The grating 51 is supported to maintain a constant posture, but the grating 52 is rotatable about an axis parallel to the V axis by a rotation mechanism 522.

1.3.2 Operation

The traveling direction of an optical beam output from the window 10a is changed in a plane parallel to an HZ plane that is orthogonal to the V axis by each of the first and second prisms 41 and 42, and the beam width of the optical beam is expanded in the plane parallel to the HZ plane. The traveling direction of the optical beam having passed through both the first and second prisms 41 and 42 and traveling toward the gratings 51 and 52 substantially matches the −Z direction, for example.

The light incident on the gratings 51 and 52 from the second prism 42 is reflected by the grooves of each of the gratings 51 and 52 and diffracted in a direction in accordance with the wavelength of the light. Accordingly, the light reflected by the grooves of each of the gratings 51 and 52 is dispersed in a plane parallel to the HZ plane. The grating 51 is disposed in Littrow arrangement such that the incident angle of the optical beam incident on the grating 51 from the second prism 42 matches the diffracting angle of diffracted light of a desired first wavelength $\lambda 1$. The grating 52 is disposed in Littrow arrangement such that the incident angle of the optical beam incident on the grating 52 from the second prism 42 matches the diffracting angle of diffracted light of a desired second wavelength $\lambda 2$. When the incident angles of the optical beams incident on the gratings 51 and 52 from the second prism 42 are different from each other, there occurs a wavelength difference between the first wavelength $\lambda 1$ of the diffracted light returned from the grating 51 to the second prism 42 and the second wavelength $\lambda 2$ of the diffracted light returned from the grating 52 to the second prism 42.

Although only optical beams in a direction from the first prism 41 toward the gratings 51 and 52 are illustrated with dashed line arrows in FIGS. 3A and 3B, an optical beam of a wavelength selected by the line narrowing device 14 travels from the gratings 51 and 52 toward the first prism 41 through paths opposite to these dashed line arrows.

The second prism 42 and the first prism 41 reduce the beam width of light returned by the gratings 51 and 52 in a plane parallel to the HZ plane and return the light into the laser chamber 10 through the window 10a.

The rotation stage 422 and the rotation mechanism 522 are controlled by the laser control processor 30.

When the rotation stage 422 slightly rotates the second prism 42, the traveling directions of optical beams output from the second prism 42 toward the gratings 51 and 52 slightly change in a plane parallel to the HZ plane. Accordingly, the incident angles of the optical beams incident on the gratings 51 and 52 from the second prism 42 slightly change. Accordingly, the first wavelength $\lambda 1$ and the second wavelength $\lambda 2$ both change.

When the rotation mechanism 522 slightly rotates the grating 52, the incident angle of an optical beam incident on the grating 51 from the second prism 42 does not change but the incident angle of an optical beam incident on the grating 52 from the second prism 42 slightly changes. Accordingly, the wavelength difference between the first wavelength $\lambda 1$ and the second wavelength $\lambda 2$ changes.

The exposure control processor 110 transmits a target value $\lambda 1t$ of the first wavelength $\lambda 1$ and a target value $\lambda 2t$ of the second wavelength $\lambda 2$ to the laser control processor 30.

The laser control processor 30 controls the rotation stage 422 based on the target value $\lambda 1t$ of the first wavelength $\lambda 1$. Accordingly, the rotation stage 422 changes the posture of the second prism 42 and adjusts the incident angle (first incident angle) of an optical beam on the grating 51 and the incident angle (second incident angle) of an optical beam on the grating 52.

The laser control processor 30 controls the rotation mechanism 522 based on the target value $\lambda 2t$ of the second wavelength $\lambda 2$. Accordingly, the rotation mechanism 522 changes the posture of the grating 52 and adjusts the second incident angle of an optical beam on the grating 52.

With the above-described configuration and operation, light of the first wavelength $\lambda 1$ and light of the second wavelength $\lambda 2$ in an optical beam output from the window 10a of the laser chamber 10 are selected and returned into the laser chamber 10. Accordingly, the line narrowed gas laser apparatus 1 can perform two-wavelength oscillation. The first wavelength $\lambda 1$ and the second wavelength $\lambda 2$ can be separately set by controlling the rotation stage 422 and the rotation mechanism 522.

A focal length in the exposure apparatus 100 (refer to FIG. 1) depends on the wavelength of a pulse laser beam. A pulse laser beam subjected to two-wavelength oscillation and emitted from the line narrowed gas laser apparatus 1 can be imaged on the workpiece table WT of the exposure apparatus 100 at two positions that are different from each other in the direction of the optical path axis of the pulse laser beam, and a focal point depth can be increased in effect. For example, when a resist film having a large film thickness is exposed, variance of imaging performance in the thickness direction of the resist film can be suppressed.

1.3.3 Problem with Comparative Example

In the comparative example, the first wavelength and the second wavelength can be separately set but an energy ratio cannot be set, and thus it has been sometimes not easy to obtain a desired sectional shape of a resist film when the resist film is exposed and developed. For example, it has been sometimes not easy to set, to a desired angle relative to the surface of a semiconductor wafer, a resist wall surface as a boundary surface between a part at which the resist film is removed through exposure and image development and a part at which the resist film is left on the semiconductor wafer.

According to embodiments described below, it is possible to accurately adjust the energy ratio of a first wavelength component and a second wavelength component included in a pulse laser beam.

Figure 4A:
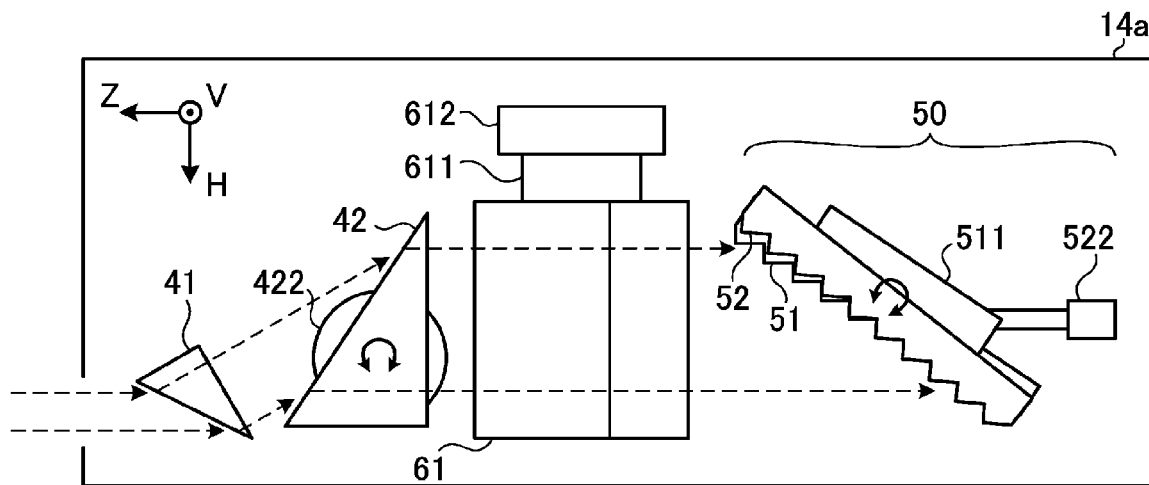
FIG. 4A schematically illustrates the configuration of a line narrowing device in a first embodiment.
Figure 4B:
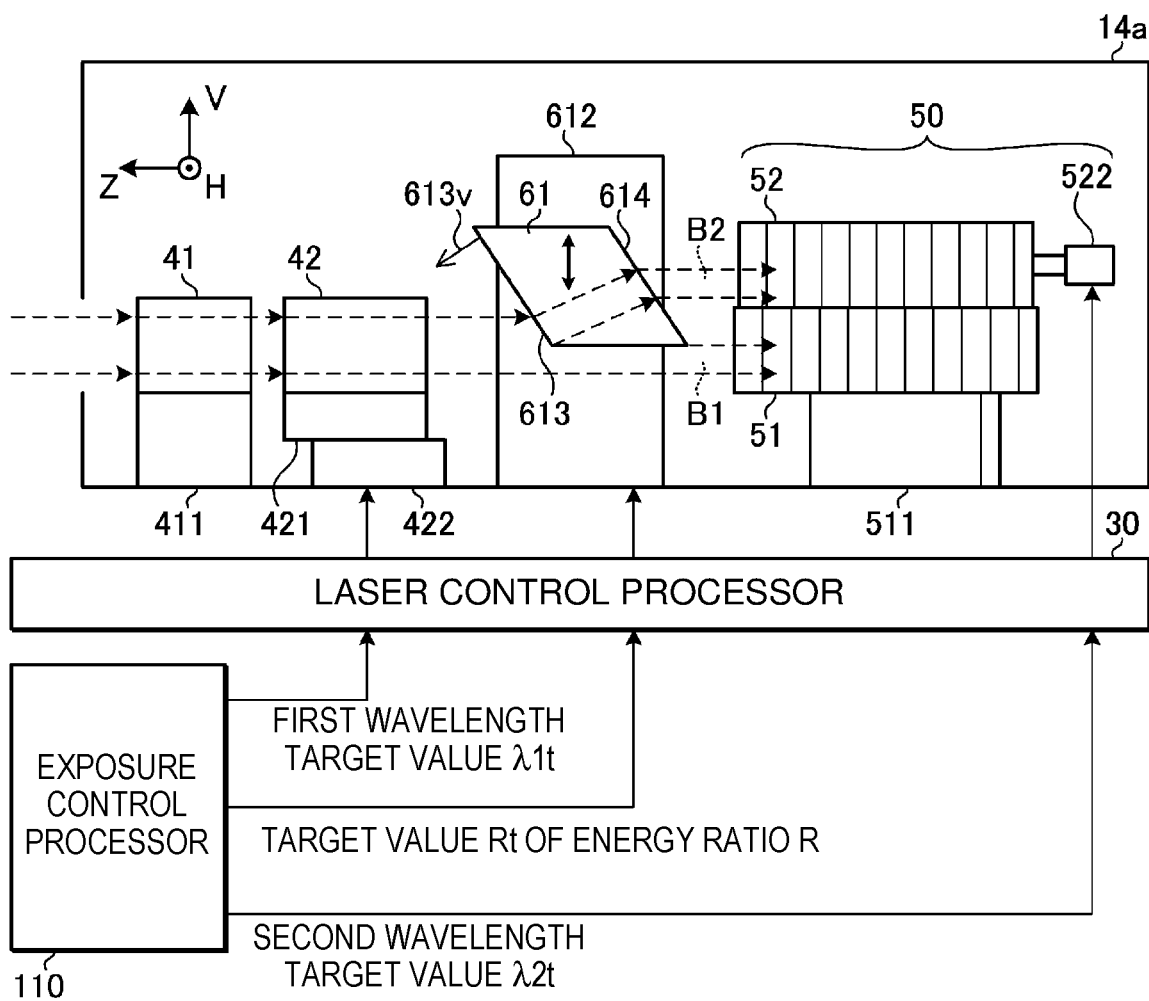
FIG. 4B schematically illustrates the configuration of the line narrowing device in the first embodiment.

2. Line Narrowed Gas Laser Apparatus Configured to Adjust Energy Ratio R by Referring to Table Data 2.1 Configuration FIGS. 4A and 4B schematically illustrate the configuration of a line narrowing device 14a in a first embodiment. FIG. 4A illustrates the line narrowing device 14a viewed in the −V direction, and FIG. 4B illustrates the line narrowing device 14a viewed in the −H direction.

The line narrowing device 14a includes a parallel plane substrate 61.

The parallel plane substrate 61 is disposed across part of a section of the optical path of an optical beam having passed through the second prism 42. The parallel plane substrate 61 is disposed on the optical path of the optical beam between the second prism 42 and the grating 52. The parallel plane substrate 61 is supported by a holder 611. The parallel plane substrate 61 is made of a material such as calcium fluoride or synthetic quartz. The parallel plane substrate 61 is movable in the −V direction and the +V direction by a linear stage 612. The linear stage 612 corresponds to an adjustment mechanism in the present disclosure.

The parallel plane substrate 61 has an incident surface 613 on which part of the optical beam having passed through the second prism 42 is incident, and an emission surface 614 through which light incident on the parallel plane substrate 61 through the incident surface 613 is output from the inside of the parallel plane substrate 61 toward the grating 52 (refer to FIG. 4B). The incident surface 613 and the emission surface 614 are both parallel to the H axis and are parallel to each other. The incident surface 613 and the emission surface 614 are tilted relative to the incident direction of the optical beam to refract the optical beam. Specifically, the incident surface 613 has a normal vector 613v parallel to a VZ surface, and the normal vector 613v has directional components in the −V direction and the +Z direction.

The memory 32 (refer to FIG. 2) included in the laser control processor 30 stores relation data indicating the relation of a parameter of the energy ratio with a control parameter Y of the linear stage 612. The relation data is, for example, table data to be described later with reference to FIG. 8.

The parameter of the energy ratio is a parameter related to the ratio of energy $E\lambda 1$ of the wavelength component of the first wavelength $\lambda 1$ and energy $E\lambda 2$ of the wavelength component of the second wavelength $\lambda 2$ in total pulse energy E of a pulse laser beam emitted from the line narrowed gas laser apparatus 1, and is, for example, an energy ratio R. The energy ratio R is the ratio of the energy $E\lambda 1$ of the wavelength component of the first wavelength $\lambda 1$ relative to the total pulse energy E of the pulse laser beam and is expressed as an expression below.

$$R = E\lambda 1/E$$

2.2 Operation of Line Narrowed Gas Laser Apparatus

A first part B1 of an optical beam having passed through the second prism 42 passes outside the parallel plane substrate 61 and enters the grating 51. A second part B2 of the optical beam transmits inside the parallel plane substrate 61 and enters the grating 52. Specifically, the line narrowing device 14a including the parallel plane substrate 61 causes the first part B1 of the optical beam to enter the grating 51 and causes the second part B2 of the optical beam to enter the grating 52. In this case, the parallel plane substrate 61 shifts the optical path axis of the second part B2 of the optical beam relative to the optical path axis of the first part B1 in the +V direction. The optical path axis is the central axis of the optical path. In this manner, the parallel plane substrate 61 adjusts the optical path of a part of the optical beam by transmitting the part of the optical beam.

Moreover, the ratio of the first part B1 and the second part B2 is changed as the linear stage 612 changes the position of the parallel plane substrate 61 in the direction of the V axis.

A larger amount of light enters the grating 52 as the second part B2 of the optical beam, which enters the parallel plane substrate 61, is increased by moving the parallel plane substrate 61 in the −V direction. Accordingly, the energy $E\lambda 2$ of the wavelength component of the second wavelength $\lambda 2$ included in the pulse laser beam increases.

A smaller amount of light enters the grating 52 as the second part B2 of the optical beam, which enters the parallel plane substrate 61, is reduced by moving the parallel plane substrate 61 in the +V direction. Accordingly, the energy $E\lambda 2$ of the wavelength component of the second wavelength $\lambda 2$ included in the pulse laser beam decreases.

The linear stage 612 may move the parallel plane substrate 61 in a direction different from the direction of the V axis. The linear stage 612 may move the parallel plane substrate 61 in a direction intersecting the HZ plane, which is orthogonal to the V axis.

The exposure control processor 110 transmits various command values of two-wavelength oscillation to the laser control processor 30. The command values of two-wavelength oscillation include the target value λ1t of the first wavelength λ1, the target value λ2t of the second wavelength λ2, a target value Rt of the energy ratio R, and a target value Et of the total pulse energy E.

The laser control processor 30 controls the linear stage 612 based on the target value Rt of the energy ratio R. Accordingly, the linear stage 612 adjusts the position of the parallel plane substrate 61, thereby adjusting the energy ratio R of the wavelength component of the first wavelength λ1 selected by the grating 51 and the wavelength component of the second wavelength λ2 selected by the grating 52.

The laser control processor 30 controls the rotation stage 422 based on the target value λ1t of the first wavelength λ1. Accordingly, the rotation stage 422 changes the posture of the second prism 42, thereby adjusting the first incident angle of the first part B1 of the optical beam on the grating 51.

The laser control processor 30 controls the rotation mechanism 522 based on the target value λ2t of the second wavelength λ2. Accordingly, the rotation mechanism 522 changes the posture of the grating 52, thereby adjusting the second incident angle of the second part B2 of the optical beam on the grating 52.

2.3 Control of Two-Wavelength Oscillation by Laser Control Processor 30

FIG. 5 is a flowchart illustrating the processing procedure of two-wavelength oscillation in the first embodiment. The laser control processor 30 performs laser control of two-wavelength oscillation through processing below.

At S1, the laser control processor 30 receives various command values of two-wavelength oscillation from the exposure control processor 110 of the exposure apparatus 100. Specific examples of the command values of two-wavelength oscillation are as described above with reference to FIG. 4B.

Subsequently at S2, the laser control processor 30 closes the shutter 18. Accordingly, the pulse laser beam does not enter the exposure apparatus 100.

Subsequently at S3, the laser control processor 30 performs wavelength control of two-wavelength oscillation. The wavelength control of two-wavelength oscillation will be described later with reference to FIG. 6.

Subsequently at S5, the laser control processor 30 performs energy control of two-wavelength oscillation. The energy control of two-wavelength oscillation will be described later with reference to FIG. 7.

Subsequently at S7, the laser control processor 30 opens the shutter 18. Accordingly, the pulse laser beam enters the exposure apparatus 100.

Subsequently at S8, the laser control processor 30 transmits a preparation-completed signal to the exposure control processor 110 of the exposure apparatus 100. After S8, the laser control processor 30 ends the processing of the present flowchart.

2.3.1 Wavelength Control of Two-Wavelength Oscillation

FIG. 6 is a flowchart illustrating the processing procedure of the wavelength control of two-wavelength oscillation. Processes illustrated in FIG. 6 correspond to subroutines of S3 in FIG. 5.

At S31, the laser control processor 30 starts adjustment oscillation for setting a wavelength.

Subsequently at S32, the laser control processor 30 detects the first wavelength λ1 and the second wavelength λ2 with the light detector 17.

Subsequently at S33, the laser control processor 30 reads the target value λ1t of the first wavelength λ1 and the target value λ2t of the second wavelength λ2 from the memory 32 (refer to FIG. 2). Thereafter, the laser control processor 30 calculates a difference Δλ1 between the first wavelength λ1 detected at S32 and the target value λ1t, and a difference Δλ2 between the second wavelength λ2 detected at S32 and the target value λ2t, by equations below.

$$\Delta\lambda1 = \lambda1 - \lambda1t$$

$$\Delta\lambda2 = \lambda2 - \lambda2t$$

Subsequently at S34, the laser control processor 30 determines whether the absolute value |Δλ1| of the difference Δλ1 is smaller than a predetermined value Δλ1L. When the absolute value |Δ1‖ of the difference Δλ1 is equal to or larger than the predetermined value Δλ1L (NO at S34), the laser control processor 30 advances the processing to S35. When the absolute value |Δ1‖ of the difference Δλ1 is smaller than the predetermined value Δλ1L (YES at S34), the laser control processor 30 advances the processing to S36.

At S35, the laser control processor 30 controls the rotation stage 422 of the second prism 42 such that the absolute value |Δ1‖ of the difference Δλ1 decreases. After S35, the laser control processor 30 returns the processing to S32. In this manner, the laser control processor 30 controls the rotation stage 422 of the second prism 42 such that the first wavelength λ1 approaches the target value λ1t.

At S36, the laser control processor 30 determines whether the absolute value |Δλ2| of the difference Δλ2 is smaller than a predetermined value Δλ2L. When the absolute value |Δλ2| of the difference Δλ2 is equal to or larger than the predetermined value Δλ2L (NO at S36), the laser control processor 30 advances the processing to S37. When the absolute value |Δλ2| of the difference Δλ2 is smaller than the predetermined value Δλ2L (YES at S36), the laser control processor 30 advances the processing to S38.

At S37, the laser control processor 30 controls the rotation mechanism 522 of the grating 52 such that the absolute value |Δλ2| of the difference Δλ2 decreases. After S37, the laser control processor 30 returns the processing to S32. In this manner, the laser control processor 30 controls the rotation mechanism 522 of the grating 52 such that the second wavelength λ2 approaches the target value λ2t.

At S38, the laser control processor 30 stops the adjustment oscillation. After S38, the laser control processor 30 ends the processing of the present flowchart and returns to the processing illustrated in FIG. 5.

2.3.2 Energy Control of Two-Wavelength Oscillation

Figure 7:
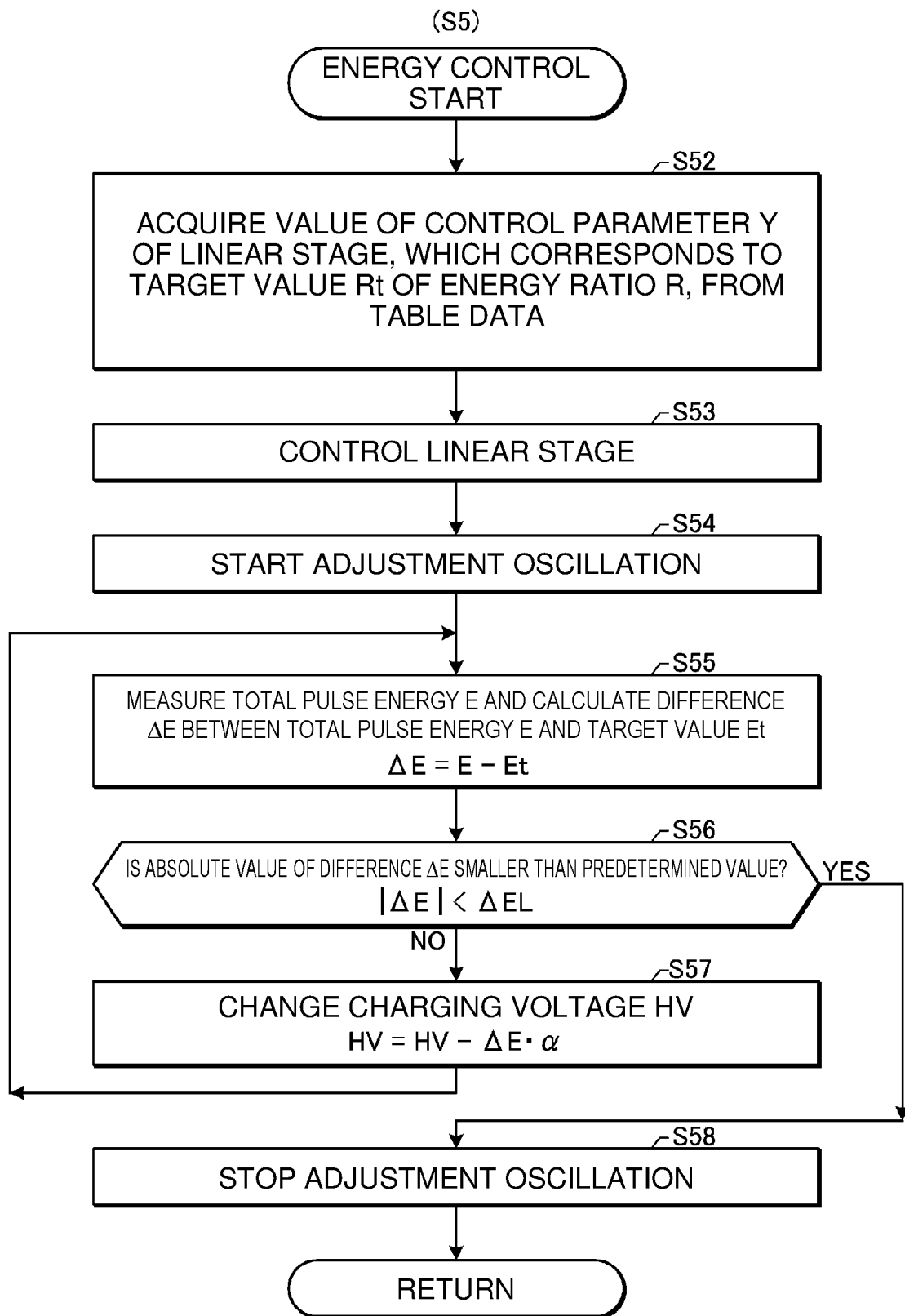
FIG. 7 is a flowchart illustrating the processing procedure of energy control of two-wavelength oscillation.

FIG. 7 is a flowchart illustrating the processing procedure of the energy control of two-wavelength oscillation. Processes illustrated in FIG. 7 correspond to subroutines of S5 in FIG. 5.

At S52, the laser control processor 30 searches table data stored in the memory 32 and acquires a value of the control parameter Y of the linear stage 612, which corresponds to the target value Rt of the energy ratio R.

Subsequently at S53, the laser control processor 30 controls the linear stage 612 in accordance with the value of the control parameter Y, which is acquired from the table data.

Subsequently at S54, the laser control processor 30 starts adjustment oscillation for setting pulse energy.

Subsequently at S55, the laser control processor 30 measures the total pulse energy E of the pulse laser beam with the light detector 17. The total pulse energy E of the pulse laser beam is energy of the pulse laser beam per pulse and equal to the sum of the energy Eλ1 of the wavelength component of the first wavelength λ1 and the energy Eλ2 of the wavelength component of the second wavelength λ2.

Thereafter, the laser control processor 30 calculates a difference ΔE between the detected total pulse energy E and the target value Et of the total pulse energy E by an equation below.

$$\Delta E = E - Et$$

Subsequently at S56, the laser control processor 30 determines whether the absolute value |ΔE| of the difference ΔE is smaller than a predetermined value ΔEL. When the absolute value |ΔE| of the difference ΔE is equal to or larger than the predetermined value ΔEL (NO at S56), the laser control processor 30 advances the processing to S57. When the absolute value |ΔE| of the difference ΔE is smaller than the predetermined value ΔEL (YES at S56), the laser control processor 30 advances the processing to S58.

At S57, the laser control processor 30 changes the charging voltage HV by an equation below.

$$HV = HV - \Delta E \cdot \alpha$$

In the expression above, α is a positive constant. For example, when the total pulse energy E is larger than the target value Et, the total pulse energy E can be reduced toward the target value Et by lowering the charging voltage HV in accordance with the difference ΔE. After S57, the laser control processor 30 returns the processing to S55.

At S58, the laser control processor 30 stops the adjustment oscillation. After S58, the laser control processor 30 ends the processing of the present flowchart and returns to the processing illustrated in FIG. 5.

Figures 8, 9:
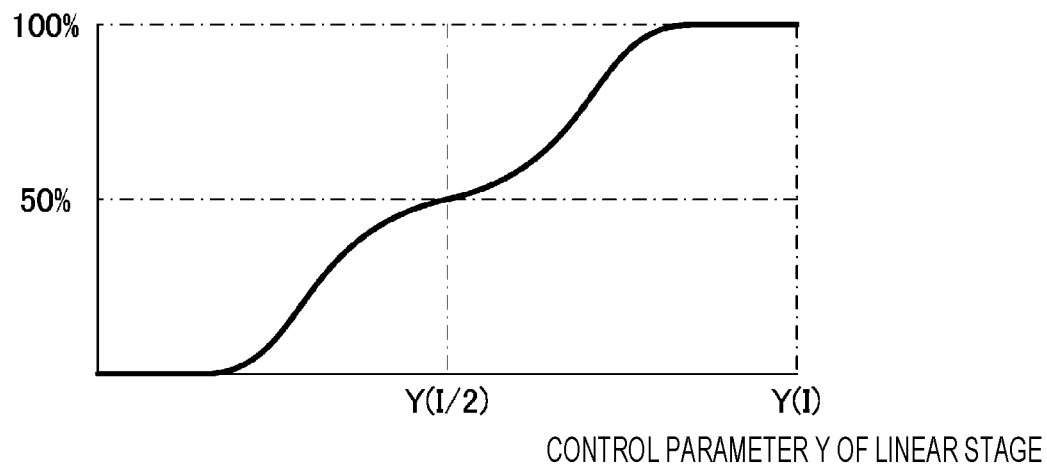
FIG. 8 conceptually illustrates table data stored in a memory.
FIG. 9 is a graph exemplarily illustrating the relation between a control parameter Y and an energy ratio R of a linear stage.

FIG. 8 conceptually illustrates the table data stored in the memory 32. The table data is data in which the control parameter Y of the linear stage 612 is associated with the energy ratio R when the linear stage 612 is controlled based on the control parameter Y. The control parameter Y of the linear stage 612 is, for example, a parameter that designates the position of the parallel plane substrate 61 in the direction of the V axis. In FIG. 8, a character or a number in parentheses indicates the correspondence relation between the control parameter Y and the energy ratio R. The character I represents an integer equal to or larger than one, and the character i represents an integer of zero to I.

FIG. 9 is a graph exemplarily illustrating the relation between the control parameter Y of the linear stage 612 and the energy ratio R. The energy ratio R may be 50% when the control parameter Y is at the median Y(I/2). The curve of the graph may have a rotationally symmetric shape with respect to a point at which the energy ratio R is 50%.

As illustrated in FIG. 9, the energy ratio R has a monotonically increasing relation with the control parameter Y in the range in which the energy ratio R is larger than 0% and smaller than 100%. Thus, a necessary control parameter Y can be uniquely determined when the target value Rt of the energy ratio R is designated in the range larger than 0% and smaller than 100%.

The other configuration and operation of the first embodiment are same as the configuration and operation of the comparative example.

2.4 Effect

In the first embodiment, the linear stage 612 as the adjustment mechanism adjusts the energy ratio R of the first wavelength component and the second wavelength component of the pulse laser beam. The laser control processor 30 stores relation data indicating the relation of the parameter of the energy ratio R with the control parameter Y of the adjustment mechanism. The laser control processor 30 receives a command value of the parameter of the energy ratio R from the exposure control processor 110 of the exposure apparatus 100 as the external device at S1 in FIG. 5, acquires a value of the control parameter Y, which corresponds to the above-described command value, based on the above-described relation data at S52 and S53 in FIG. 7, and controls the adjustment mechanism based on the value. Accordingly, the energy ratio R of the first wavelength component and the second wavelength component of the pulse laser beam can be accurately adjusted. The energy ratio R can be adjusted also when the line narrowed gas laser apparatus 1 is provided with no light detector for measuring the energy ratio. Then, exposure is performed by using the pulse laser beam to obtain a resist wall surface through development at a desired angle relative to the surface of the semiconductor wafer.

In the first embodiment, before controlling the adjustment mechanism at S53 in FIG. 7, the laser control processor 30 controls the posture of the second prism 42 and the posture of the grating 52 through the processing in FIG. 6 such that the wavelengths λ1 and λ2 of the first and second wavelength components approach the target values λ1t and λ2t, respectively. When the first wavelength λ1 and the second wavelength λ2 are changed, the efficiency of diffraction at the gratings 51 and 52 changes, and accordingly, the energy ratio R changes in some cases. The energy ratio R can be adjusted through a small number of iterations by adjusting the first wavelength λ1 and the second wavelength λ2 before the energy ratio R is adjusted by the adjustment mechanism.

In the first embodiment, after controlling the adjustment mechanism at S53 in FIG. 7, the laser control processor 30 measures, through the processing at S55 to S57, the total pulse energy E of the pulse laser beam including the first wavelength component and the second wavelength component and controls the charging voltage HV of the charger 12 such that the total pulse energy E approaches the target value Et. When the energy ratio R is adjusted by the adjustment mechanism, the path of an optical beam inside the optical resonator changes, and accordingly, the total pulse energy E changes in some cases. The total pulse energy E can be adjusted through a small number of iterations by adjusting the total pulse energy E after the energy ratio R is adjusted by the adjustment mechanism.

3. Line Narrowed Gas Laser Apparatus Configured to Adjust Energy Ratio R with Taken into Account Charging Voltage HV and Gas Pressure P 3.1 Configuration and Operation The configuration of the line narrowing device 14a in a second embodiment is same as that described above with reference to FIGS. 4A and 4B. The processing procedure of two-wavelength oscillation and wavelength control of two-wavelength oscillation in the second embodiment are same as those described with reference to FIGS. 5 and 6, respectively.

The second embodiment is different from the first embodiment in that the control parameter Y of the linear stage 612 is determined with taken into account the charging voltage HV of the charger 12 and the gas pressure P inside the laser chamber 10 as well as the target value Rt of the energy ratio R.

In the second embodiment, relation data stored in the memory 32 indicates the relation of the energy ratio R with a combination of the control parameter Y of the linear stage 612, the charging voltage HV of the charger 12, and the gas pressure P inside the laser chamber 10. The relation data is, for example, table data to be described later with reference to FIGS. 11A and 11B.

FIG. 10 is a flowchart illustrating the processing procedure of the energy control of two-wavelength oscillation in the second embodiment. Processes illustrated in FIG. 10 correspond to subroutines of S5 in FIG. 5.

At S51b, the laser control processor 30 starts adjustment oscillation for setting pulse energy.

The laser control processor 30 sets the charging voltage HV of the charger 12 based on the target value Et of the total pulse energy E, which is acquired at S1 in FIG. 5. The laser control processor 30 receives measured data of the total pulse energy E from the light detector 17 and performs feedback control of the charging voltage HV based on the target value Et of the total pulse energy E and the measured data of the total pulse energy E. The charging voltage HV set through the feedback control is referred to as first voltage HV1.

The laser control processor 30 receives measured data of the gas pressure P inside the laser chamber 10 from the pressure sensor 16.

Subsequently at S52b, the laser control processor 30 searches the table data stored in the memory 32 and acquires a value of the control parameter Y of the linear stage 612, which corresponds to the target value Rt of the energy ratio R, the first voltage HV1, and the gas pressure P.

Subsequently at S53, the laser control processor 30 controls the linear stage 612 in accordance with the value of the control parameter Y, which is acquired from the table data.

Processing at subsequent S55 to S57 is same as that described with reference to FIG. 7 except for a point described below.

When the energy ratio R is adjusted by controlling the linear stage 612, the path of an optical beam inside the optical resonator changes, and accordingly, the total pulse energy E changes in some cases. Thus, the total pulse energy E is measured at S55, and the charging voltage HV is changed in accordance with the difference ΔE between the total pulse energy E and the target value Et at S57. The charging voltage HV newly set at S57 is referred to as second voltage HV2.

After S57, the laser control processor 30 returns the processing to S52b. After S57, the second voltage HV2 is used as the charging voltage HV when S52b is executed again.

Similarly to FIG. 7, when the absolute value |ΔE| of the difference ΔE between the total pulse energy E and the target value Et is smaller than the predetermined value ΔEL at S56, the adjustment oscillation is stopped at S58, and thereafter, the processing of the present flowchart ends.

FIGS. 11A and 11B conceptually illustrate the table data stored in the memory 32. The table data is data in which a combination of the control parameter Y of the linear stage 612, the charging voltage HV of the charger 12, and the gas pressure P inside the laser chamber 10 is associated with the energy ratio R when laser oscillation is performed by using the combination of control values. In FIGS. 11A and 11B, a character or a number in parentheses indicates the correspondence relation between the above-described combination of control values and the energy ratio R. The characters J and K each represent an integer equal to or larger than one, the character j represents an integer of zero to J, and the character k represents an integer of zero to K.

Although only two values Y(1) and Y(2) are illustrated as values of the control parameter Y of the linear stage 612 in FIGS. 11A and 11B, the table data may be produced for a larger number of values.

The above description is made on the case in which the energy ratio R is associated with a combination of the control parameter Y, the charging voltage HV, and the gas pressure P, but the present disclosure is not limited to the case.

The table data may associate the energy ratio R with a combination of the control parameter Y and the charging voltage HV. The laser control processor 30 may acquire a value of the control parameter Y, which corresponds to a combination of the target value Rt of the energy ratio R and the charging voltage HV.

The table data may associate the energy ratio R with a combination of the control parameter Y and the gas pressure P. The laser control processor 30 may acquire a value of the control parameter Y, which corresponds to a combination of the target value Rt of the energy ratio R and the gas pressure P.

Figure 12A:
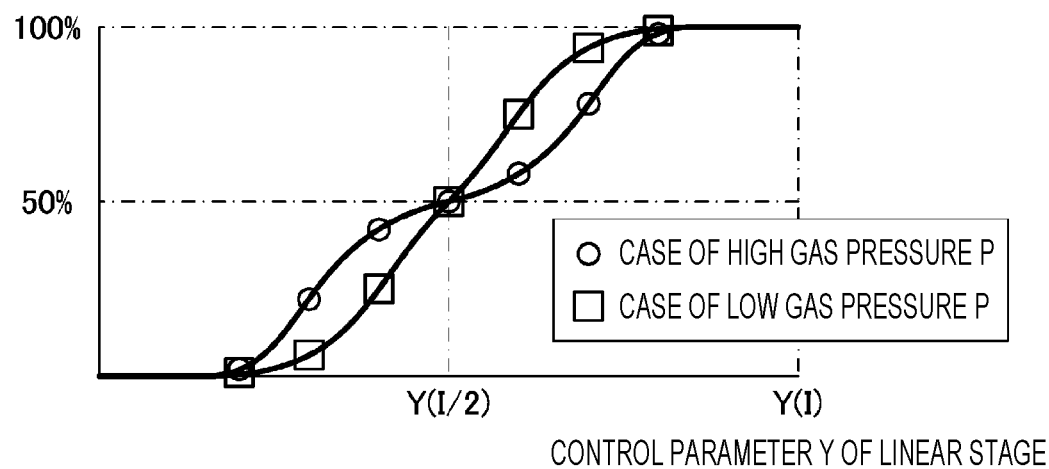
FIG. 12A is a graph exemplarily illustrating the relation between the control parameter Y and the energy ratio R of the linear stage.

FIG. 12A is a graph exemplarily illustrating the relation between the control parameter Y of the linear stage 612 and the energy ratio R. In FIG. 12A, it is indicated that the shape of the graph can change between cases of a first value and a second value of the gas pressure P inside the laser chamber 10. Specifically, change of the energy ratio R along with change of the control parameter Y can be steeper when the gas pressure P is low than when the gas pressure P is high.

Figure 12B:
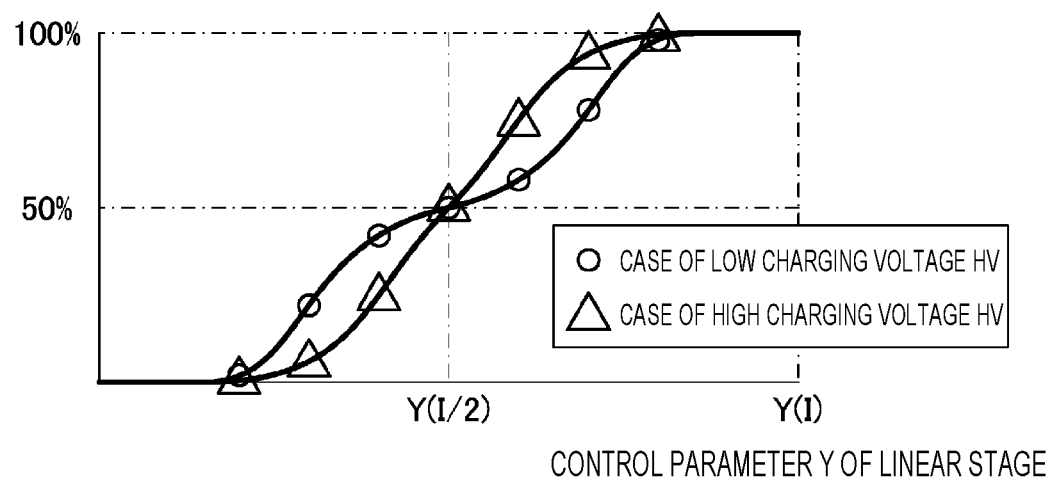
FIG. 12B is another graph exemplarily illustrating the relation between the control parameter Y and the energy ratio R of the linear stage.

FIG. 12B is another graph exemplarily illustrating the relation between the control parameter Y of the linear stage 612 and the energy ratio R. In FIG. 12B, it is indicated that the shape of the graph can change between cases of a first value and a second value of the charging voltage HV of the charger 12. Specifically, change of the energy ratio R along with change of the control parameter Y can be steeper when the charging voltage HV is high than when the charging voltage HV is low.

As understood from FIGS. 12A and 12B, the energy ratio R has a monotonically increasing relation with the control parameter Y, irrespective of the values of the charging voltage HV and the gas pressure P, in the range in which the energy ratio R is larger than 0% and smaller than 100%. Thus, a necessary control parameter Y can be uniquely determined when the charging voltage HV and the gas pressure P are specified, and in addition, the target value Rt of the energy ratio R is designated in the range larger than 0% and smaller than 100%.

The other configuration and operation of the second embodiment are same as the configuration and operation of the first embodiment.

3.2 Effect

In the second embodiment, the line narrowed gas laser apparatus 1 includes the pulse power module 13 configured to apply high voltage in pulses to the pair of electrodes 11a and 11b, and the charger 12 configured to store electric energy to be supplied to the pulse power module 13. Relation data stored in the laser control processor 30 indicates the relation of the parameter of the energy ratio R with a combination of the control parameter Y of the adjustment mechanism and the charging voltage HV of the charger 12. The laser control processor 30 sets the charging voltage HV of the charger 12 to the first voltage HV1 and acquires a value of the control parameter Y, which corresponds to a combination of the command value of the parameter of the energy ratio R and the first voltage HV1, based on the relation data. Accordingly, the energy ratio R of the first wavelength component and the second wavelength component of the pulse laser beam can be accurately adjusted with taken into account the charging voltage HV of the charger 12.

In the second embodiment, the laser control processor 30 acquires a value of the control parameter Y, which corresponds to a combination of the command value of the parameter of the energy ratio R and the first voltage HV1, based on the relation data at S52b in FIG. 10, and controls the adjustment mechanism at S53. Thereafter, through the processing at S55 to S57, the laser control processor 30 measures the total pulse energy E of the pulse laser beam including the first wavelength component and the second wavelength component and sets the charging voltage HV of the charger 12 to the second voltage HV2 such that the total pulse energy E approaches the target value Et. Thereafter, the laser control processor 30 returns to S52b, acquires a value of the control parameter Y, which corresponds to a combination of the command value of the parameter of the energy ratio R and the second voltage HV2, based on the relation data, and controls the adjustment mechanism at S53 based on the newly acquired value of the control parameter Y.

When the energy ratio R is adjusted by the adjustment mechanism, the path of an optical beam inside the optical resonator changes, and accordingly, the total pulse energy E changes in some cases. Thus, after the energy ratio R is adjusted by the adjustment mechanism, the total pulse energy E is measured and the charging voltage HV is changed from the first voltage HV1 to the second voltage HV2 based on a result of the measurement. When the charging voltage HV is changed, data obtained from the relation data changes and thus a new value of the control parameter Y is acquired with reference to the relation data again. Accordingly, the energy ratio R of the first wavelength component and the second wavelength component of the pulse laser beam can be accurately adjusted with taken into account the charging voltage HV of the charger 12.

In the second embodiment, the relation data stored in the laser control processor 30 indicates the relation of the parameter of the energy ratio R with a combination of the control parameter Y of the adjustment mechanism and the gas pressure P inside the laser chamber 10. The laser control processor 30 receives measured data of the gas pressure P inside the laser chamber 10 and acquires a value of the control parameter Y, which corresponds to a combination of the command value of the parameter of the energy ratio R and the gas pressure P, based on the relation data. Accordingly, the energy ratio R of the first wavelength component and the second wavelength component of the pulse laser beam can be accurately adjusted with taken into account the gas pressure P inside the laser chamber 10.

In the second embodiment, the line narrowed gas laser apparatus 1 includes the pulse power module 13 configured to apply high voltage in pulses to the pair of electrodes 11a and 11b, and the charger 12 configured to store electric energy to be supplied to the pulse power module 13. The relation data stored in the laser control processor 30 indicates the relation of the parameter of the energy ratio R with a combination of the control parameter Y of the adjustment mechanism, the charging voltage HV of the charger 12, and the gas pressure P inside the laser chamber 10. The laser control processor 30 sets the charging voltage HV of the charger 12 to the first voltage HV1, receives measured data of the gas pressure P inside the laser chamber 10, and acquires a value of the control parameter Y, which corresponds to a combination of the command value of the parameter of the energy ratio R, the first voltage HV1, and the gas pressure P, based on the relation data. Accordingly, the energy ratio R of the first wavelength component and the second wavelength component of the pulse laser beam can be accurately adjusted with taken into account the charging voltage HV of the charger 12 and the gas pressure P inside the laser chamber 10.

4. Other

The description of the first and second embodiments is made on the case in which various command values of two-wavelength oscillation are output by the exposure control processor 110 included in the exposure apparatus 100, but the present disclosure is not limited to the case. For example, these command values may be output by a non-illustrated controller as an external device configured to collectively control a plurality of exposure apparatuses 100.

The description of the first and second embodiments is made on the case in which the line narrowed gas laser apparatus 1 includes the two gratings 51 and 52 and performs two-wavelength oscillation, but the present disclosure is not limited to the case. For example, the line narrowed gas laser apparatus 1 may include three gratings or more and perform laser oscillation with three wavelengths or more and the control parameter may be acquired from the relation between the control parameter and the energy ratio.

The description of the first and second embodiments is made on the case in which the line narrowing device 14a includes the parallel plane substrate 61, but the present disclosure is not limited to the case. For example, the position of an optical beam may be shifted through a combination of a plurality of prisms (not illustrated) in place of the parallel plane substrate 61 and the amount of the shift may be changed by moving any of the prisms.

The description of the first and second embodiments is made on the case in which the optical path axis is shifted as the linear stage 612 moves the parallel plane substrate 61, but the present disclosure is not limited to the case. The optical path axis may be shifted as a non-illustrated rotation stage rotates the parallel plane substrate 61 about an axis parallel to the H axis.

The description of the first and second embodiments is made on the case in which a value of the control parameter Y is acquired by searching table data stored in the memory 32 (refer to FIGS. 8, 11A, and 11B), but the present disclosure is not limited to the case. When the relation of the energy ratio R with the control parameter Y can be approximated with a curve as illustrated in FIG. 9 and the curve can be expressed as a function, a value of the control parameter Y may be calculated by substituting the target value Rt of the energy ratio R into the function. Alternatively, when the relation of the energy ratio R with a combination of the control parameter Y, the charging voltage HV, and the gas pressure P can be approximated with a function, a value of the control parameter Y may be calculated by substituting the target value Rt of the energy ratio R, the charging voltage HV, and the gas pressure P into the function. These functions may be stored in the memory 32. The description of the first and second embodiments is made on the case in which wavelength control is performed by detecting the first wavelength $\lambda 1$ and the second wavelength $\lambda 2$ and comparing the detected values with the target values $\lambda 1t$ and $\lambda 2t$, respectively, but the present disclosure is not limited to the case. A wavelength difference $\delta\lambda$ between the first wavelength $\lambda 1$ and the second wavelength λ2 may be detected in place of the second wavelength λ2. Specifically, wavelength control may be performed by detecting the first wavelength λ1 and the wavelength difference δλ and comparing the detected values with the target value λ1t of the first wavelength λ1 and a target value δλt of the wavelength difference δλ, respectively.

The description of the first and second embodiments is made on the case in which the parameter of the energy ratio includes the energy ratio R, and the energy ratio R is the ratio of the pulse energy Eλ1 of the wavelength component of the first wavelength λ1 relative to the total pulse energy E of the pulse laser beam, but the present disclosure is not limited to the case. The parameter of the energy ratio may be any parameter related to the ratio of energy of the wavelength component of the first wavelength λ1 and energy of the wavelength component of the second wavelength λ2. For example, the parameter of the energy ratio may be a value obtained by dividing the pulse energy Eλ1 of the wavelength component of the first wavelength λ1 by the pulse energy Eλ2 of the wavelength component of the second wavelength λ2. Alternatively, for example, the parameter of the energy ratio may be a combination of the value of the pulse energy Eλ1 of the wavelength component of the first wavelength λ1 and the value of the pulse energy Eλ2 of the wavelength component of the second wavelength λ2.

The description of the second embodiment is made on the case in which the control parameter Y of the linear stage 612 is determined with taken into account the charging voltage HV of the charger 12 and the gas pressure P inside the laser chamber 10 as well as the target value Rt of the energy ratio R, but the present disclosure is not limited to the case. The control parameter Y of the linear stage 612 may be determined with taken into account the target value Rt of the energy ratio R and the charging voltage HV of the charger 12. The control parameter Y of the linear stage 612 may be determined with taken into account the target value Rt of the energy ratio R and the gas pressure P inside the laser chamber 10.

The description above is intended to be illustrative and the present disclosure is not limited thereto.

Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A control method for a line narrowed gas laser apparatus configured to emit a pulse laser beam including a first wavelength component and a second wavelength component,
   the line narrowed gas laser apparatus comprising:
   a laser chamber including a pair of electrodes;
   an optical resonator including an adjustment mechanism configured to adjust a parameter of an energy ratio of the first wavelength component and the second wavelength component; and
   a processor in which relation data indicating a relation of the parameter of the energy ratio with a control parameter of the adjustment mechanism is stored,
   the control method comprising:
   receiving a command value of the parameter of the energy ratio from an external device; and
   acquiring, based on the relation data, a value of the control parameter corresponding to the command value and controlling the adjustment mechanism based on the value of the control parameter.

2. The control method according to claim 1, further comprising, before controlling the adjustment mechanism, controlling the line narrowed gas laser apparatus such that a wavelength of each of the first wavelength component and the second wavelength component approaches a target value.

3. The control method according to claim 1, further comprising, after controlling the adjustment mechanism, measuring total pulse energy of the pulse laser beam including the first wavelength component and the second wavelength component and controlling the line narrowed gas laser apparatus such that the total pulse energy approaches a target value.

4. The control method according to claim 1, wherein the parameter of the energy ratio includes a ratio of pulse energy of the first wavelength component relative to total pulse energy of the pulse laser beam including the first wavelength component and the second wavelength component.

5. The control method according to claim 1, wherein the parameter of the energy ratio includes a value of pulse energy of the first wavelength component and a value of pulse energy of the second wavelength component.

6. The control method according to claim 1, wherein
   the line narrowed gas laser apparatus further includes:
   a pulse power module configured to apply high voltage in pulses to the pair of electrodes; and
   a charger configured to store electric energy to be supplied to the pulse power module,
   the relation data indicates a relation of the parameter of the energy ratio with a combination of the control parameter of the adjustment mechanism and charging voltage of the charger,
   the control method further includes setting the charging voltage of the charger to first voltage, and
   the value of the control parameter corresponding to a combination of the command value and the first voltage is acquired based on the relation data.

7. The control method according to claim 6, further comprising, after controlling the adjustment mechanism:
   measuring total pulse energy of the pulse laser beam including the first wavelength component and the second wavelength component;
   setting the charging voltage of the charger to second voltage such that the total pulse energy approaches a target value;
   then acquiring, based on the relation data, the value of the control parameter corresponding to a combination of the command value and the second voltage; and
   controlling the adjustment mechanism based on the newly acquired value of the control parameter.

8. The control method according to claim 1, wherein the relation data indicates a relation of the parameter of the energy ratio with a combination of the control parameter of the adjustment mechanism and gas pressure inside the laser chamber, the control method further includes receiving measured data of the gas pressure inside the laser chamber, and the value of the control parameter corresponding to a combination of the command value and the gas pressure is acquired based on the relation data.

9. The control method according to claim 1, wherein the line narrowed gas laser apparatus further includes:
 a pulse power module configured to apply high voltage in pulses to the pair of electrodes; and
 a charger configured to store electric energy to be supplied to the pulse power module, the relation data indicates a relation of the parameter of the energy ratio with a combination of the control parameter of the adjustment mechanism, charging voltage of the charger, and gas pressure inside the laser chamber, the control method further includes:
 setting the charging voltage of the charger to first voltage; and
 receiving measured data of the gas pressure inside the laser chamber, and the value of the control parameter corresponding to a combination of the command value, the first voltage, and the gas pressure is acquired based on the relation data.

10. The control method according to claim 9, further comprising, after controlling the adjustment mechanism:
 measuring total pulse energy of the pulse laser beam including the first wavelength component and the second wavelength component;
 setting the charging voltage of the charger to second voltage such that the total pulse energy approaches a target value;
 then acquiring, based on the relation data, the value of the control parameter corresponding to a combination of the command value, the second voltage, and the gas pressure; and
 controlling the adjustment mechanism based on the newly acquired value of the control parameter.

11. A line narrowed gas laser apparatus configured to emit a pulse laser beam including a first wavelength component and a second wavelength component, the line narrowed gas laser apparatus comprising:
 a laser chamber including a pair of electrodes;
 an optical resonator including an adjustment mechanism configured to adjust a parameter of an energy ratio of the first wavelength component and the second wavelength component; and
 a processor configured to
  store relation data indicating a relation of the parameter of the energy ratio with a control parameter of the adjustment mechanism,
  receive a command value of the parameter of the energy ratio from an external device, and
  acquire, based on the relation data, a value of the control parameter corresponding to the command value and control the adjustment mechanism based on the value of the control parameter.

12. The line narrowed gas laser apparatus according to claim 11, wherein, before controlling the adjustment mechanism, the processor controls the line narrowed gas laser apparatus such that a wavelength of each of the first wavelength component and the second wavelength component approaches a target value.

13. The line narrowed gas laser apparatus according to claim 11, wherein, after controlling the adjustment mechanism, the processor measures total pulse energy of the pulse laser beam including the first wavelength component and the second wavelength component and controls the line narrowed gas laser apparatus such that the total pulse energy approaches a target value.

14. The line narrowed gas laser apparatus according to claim 11, wherein the parameter of the energy ratio includes a ratio of pulse energy of the first wavelength component relative to total pulse energy of the pulse laser beam including the first wavelength component and the second wavelength component.

15. The line narrowed gas laser apparatus according to claim 11, wherein the parameter of the energy ratio includes a value of pulse energy of the first wavelength component and a value of pulse energy of the second wavelength component.

16. The line narrowed gas laser apparatus according to claim 11, further comprising:
 a pulse power module configured to apply high voltage in pulses to the pair of electrodes; and
 a charger configured to store electric energy to be supplied to the pulse power module, wherein
 the relation data indicates a relation of the parameter of the energy ratio with a combination of the control parameter of the adjustment mechanism and charging voltage of the charger, and
 the processor
  sets the charging voltage of the charger to first voltage, and
  acquires, based on the relation data, the value of the control parameter corresponding to a combination of the command value and the first voltage.

17. The line narrowed gas laser apparatus according to claim 16, wherein, after controlling the adjustment mechanism, the processor
 measures total pulse energy of the pulse laser beam including the first wavelength component and the second wavelength component,
 sets the charging voltage of the charger to second voltage such that the total pulse energy approaches a target value,
 then acquires, based on the relation data, the value of the control parameter corresponding to a combination of the command value and the second voltage, and
 controls the adjustment mechanism based on the newly acquired value of the control parameter.

18. The line narrowed gas laser apparatus according to claim 11, wherein
 the relation data indicates a relation of the parameter of the energy ratio with a combination of the control parameter of the adjustment mechanism and gas pressure inside the laser chamber, and
 the processor
  receives measured data of the gas pressure inside the laser chamber, and
  acquires, based on the relation data, the value of the control parameter corresponding to a combination of the command value and the gas pressure.

19. The line narrowed gas laser apparatus according to claim 11, further comprising:
 a pulse power module configured to apply high voltage in pulses to the pair of electrodes; and
 a charger configured to store electric energy to be supplied to the pulse power module,
 the relation data indicates a relation of the parameter of the energy ratio with a combination of the control parameter of the adjustment mechanism, charging voltage of the charger, and gas pressure inside the laser chamber, and the processor
sets the charging voltage of the charger to first voltage,
receives measured data of the gas pressure inside the laser chamber, and
acquires, based on the relation data, the value of the control parameter corresponding to a combination of the command value, the first voltage, and the gas pressure.

20. An electronic device manufacturing method comprising:
generating a pulse laser beam with a line narrowed gas laser apparatus;
emitting the pulse laser beam to an exposure apparatus; and
exposing a photosensitive substrate to the pulse laser beam in the exposure apparatus to manufacture an electronic device, wherein
the line narrowed gas laser apparatus is a line narrowed gas laser apparatus configured to emit the pulse laser beam including a first wavelength component and a second wavelength component and includes
a laser chamber including a pair of electrodes,
an optical resonator including an adjustment mechanism configured to adjust a parameter of an energy ratio of the first wavelength component and the second wavelength component, and
a processor configured to
store relation data indicating a relation of the parameter of the energy ratio with a control parameter of the adjustment mechanism,
receive a command value of the parameter of the energy ratio from an external device, and
acquire, based on the relation data, a value of the control parameter corresponding to the command value and control the adjustment mechanism based on the value of the control parameter.

* * * * *